United States Patent
O'Donnell et al.

(10) Patent No.: US 10,324,503 B1
(45) Date of Patent: Jun. 18, 2019

(54) CONFIGURABLE BEZEL FOR ATTACHMENT TO ELECTRONIC EQUIPMENT CHASSIS

(71) Applicant: EMC IP Holding Company LLC, Hopkinton, MA (US)

(72) Inventors: Sean P. O'Donnell, Poughkeepsie, NY (US); Samantha L. Weber, Waltham, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/686,639

(22) Filed: Aug. 25, 2017

Related U.S. Application Data

(60) Provisional application No. 62/379,966, filed on Aug. 26, 2016.

(51) Int. Cl.
| | |
|---|---|
| *G06F 1/18* | (2006.01) |
| *H05K 7/18* | (2006.01) |
| *H05K 9/00* | (2006.01) |

(52) U.S. Cl.
CPC .............. *G06F 1/182* (2013.01); *G06F 1/181* (2013.01); *H05K 7/18* (2013.01); *H05K 9/0062* (2013.01); *H05K 9/0081* (2013.01)

(58) Field of Classification Search
CPC ....... G06F 1/181; G06F 1/182; H05K 9/0062; H05K 9/0081; H05K 7/18
See application file for complete search history.

(56) References Cited

U.S. PATENT DOCUMENTS

| | | | |
|---|---|---|---|
| 5,547,272 A | 8/1996 | Paterson et al. | |
| 6,252,160 B1* | 6/2001 | Chang | H05K 9/0016 174/377 |
| 6,519,140 B1* | 2/2003 | Kim | G06F 1/181 220/4.02 |
| 6,554,378 B1 | 4/2003 | Foslien et al. | |
| 7,554,811 B2* | 6/2009 | Scicluna | G06F 1/184 312/223.1 |
| 7,684,213 B2* | 3/2010 | Titus | G06F 1/182 361/800 |
| 7,974,092 B2* | 7/2011 | Zhang | H05K 5/0239 361/679.58 |
| 2002/0060901 A1 | 5/2002 | Felcman et al. | |
| 2005/0141192 A1* | 6/2005 | Song | H05K 7/1487 361/692 |
| 2010/0014231 A1* | 1/2010 | Zhang | G06F 1/181 361/679.02 |
| 2016/0128230 A1* | 5/2016 | Lam | H05K 7/20727 361/695 |

* cited by examiner

*Primary Examiner* — Nidhi Thaker
(74) *Attorney, Agent, or Firm* — Ryan, Mason & Lewis, LLP

(57) ABSTRACT

A bezel comprises a base, a cover and at least one insertable component. The base comprises a plurality of openings. The cover is configured for mounting to a front of the base, and the cover comprises at least a first aperture. When the cover is mounted to the base, the first aperture aligns with at least a first one of the plurality of openings in the base. The at least one insertable component is configured for mounting to the base in the first opening through the first aperture of the cover. The bezel is configured for attachment to a front portion of an electronic equipment chassis.

20 Claims, 18 Drawing Sheets

CONFIGURABLE BEZEL FOR ATTACHMENT TO ELECTRONIC EQUIPMENT CHASSIS

PRIORITY CLAIM

The present application claims priority to U.S. Provisional Application Ser. No. 62/379,966, filed Aug. 26, 2016 and entitled "Infrastructure Bezel System," which is incorporated by reference herein in its entirety.

FIELD

The field relates generally to electronic equipment, and more particularly to bezel and chassis configurations for such electronic equipment.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

SUMMARY

Illustrative embodiments provide a configurable bezel. The configurable bezel illustratively has a standard form factor for attachment to an electronic equipment chassis.

In one embodiment, a bezel comprises a base, a cover and at least one insertable component. The base comprises a plurality of openings. The cover is configured for mounting to a front of the base, and the cover comprises at least a first aperture. When the cover is mounted to the base, the first aperture aligns with at least a first one of the plurality of openings in the base. The at least one insertable component is configured for mounting to the base in the first opening through the first aperture of the cover. The bezel is configured for attachment to a front portion of an electronic equipment chassis.

In some embodiments, the plurality of openings in the base of the bezel comprise hexagonal openings arranged in a hexagonal grid.

Such an arrangement advantageously provides a high degree of flexibility in the configuration of bezels, such as configuring bezels with branding or other identifiers of components installed within the electronic equipment chassis.

Moreover, illustrative embodiments facilitate the efficient design and development of electronic components such as storage devices that are installed in electronic equipment chassis, as the labeling or identifying of such components via inserts, outserts and name plates or other insertable components in a configurable bezel allows for flexible design changes throughout development.

These and other embodiments include, without limitation, apparatus, systems and methods. For example, an exemplary apparatus or system in another embodiment of the invention illustratively comprises an electronic equipment chassis having one or more bezels attached thereto.

DETAILED DESCRIPTION

Figure 1:
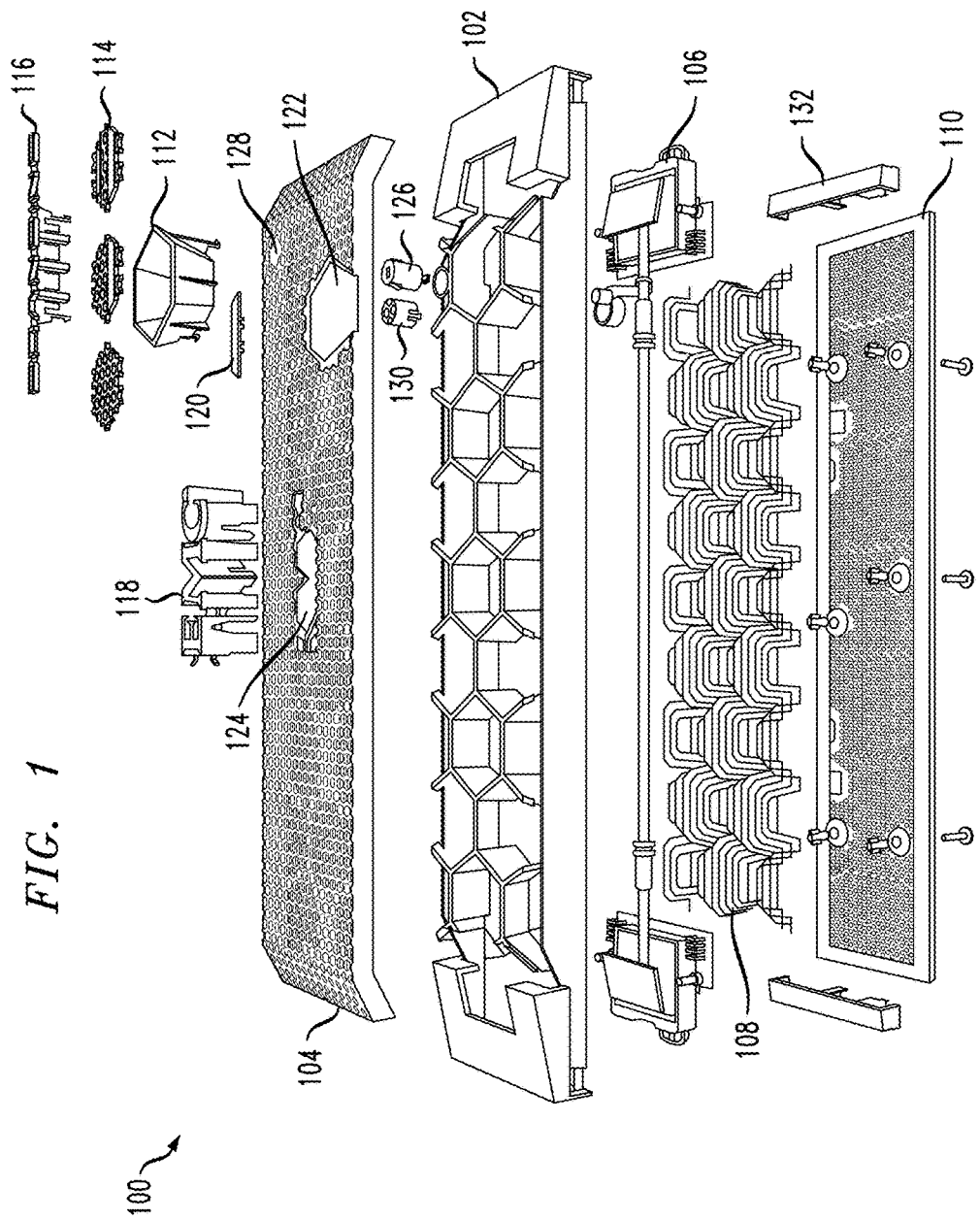
FIG. 1 shows an exploded view of a configurable bezel in an illustrative embodiment.

Illustrative embodiments will be described herein with reference to exemplary bezel and chassis configurations for electronic equipment such as storage drives. It is to be appreciated, however, that embodiments of the invention are not restricted to the particular illustrative configurations shown. Accordingly, terms such as "electronic equipment chassis" as used herein are intended to be broadly construed, so as to encompass, for example, a wide variety of other arrangements of storage drives or other types of computer components or other electronic equipment, possibly arranged with other types of electrical equipment in a common housing of an electronic equipment chassis.

In some embodiments, a configurable bezel is provided, which may be created and designed as a common flexible framework to support a large variety of assembly configurations. Configurable bezels described herein may be scalable, such as including a scalable and adaptable hexagonal grid of openings which increases flexibility through various stages of design, engineering and manufacturing. Configurable bezels in some embodiments utilize common parts and tools, which can provide cost savings and strong design language "DNA" that may be used to communicate brand equity.

In conventional approaches, a new bezel is created upon designing a new product such as a new storage device. Creating a new bezel, however, may require extensive time and development cost commitments related to design, engineering, tooling, manufacturing and testing. Illustrative embodiments overcome these and other disadvantages in providing a modular design wherein name plates, placards, branding or other identifiers may be incorporated into a configurable bezel that may be reused for a wide variety of different types of storage devices or other electronic equipment.

Bezels, in addition to functional aspects, may also have aesthetic aspects designed to present invaluable brand equity through visual relationships in a company's design language. Unique visual details may be frequently used to visually communicate advancements in hardware and software technologies. Volatility in compute and storage technologies, however, may require many new designs across a company's product portfolio. Requiring creation and design of new bezels for each new product can disrupt and slow down a design cycle, increasing costs through the stages of development into manufacturing.

Further, once a product is released into production, modifying an existing design of a bezel may be difficult. Sometimes, modifying the bezel requires extensive design, engineering and manufacturing efforts, particularly in a high mix, low volume product portfolio.

In some embodiments, techniques are provided which enable creation of a bezel that may be scalable, such as through an adaptable system of openings in a base of the bezel, designed to increase flexibility throughout development, providing cost savings while strengthening visual brand equity. The adaptable system of openings in the base of a bezel, which may be in the form of a hexagonal grid of hexagonal-shaped openings, can scale within storage rack unit increments maintaining seamless linking geometry. Configurable bezels in some embodiments thus provide a common platform designed to carry all variations of functional components within an electronic equipment chassis. The base of the bezel may include openings arranged in a base geometry which remains constant while individual components are designed to fit within one or more designated openings in the base geometry.

The use of a base geometry, such as openings arranged in hexagonal grid, as a constraint may reduce facets of engineering around fit and function. Further, aesthetic design elements may be enabled and designed for assembling a bezel from the front or rear without affecting functional components of an electronic equipment chassis that the bezel is attached to. Designing around a base geometry introduces a design constraint which may help to visually knit a large variety of bezel designs but with immense flexibility for individualizing respective bezel designs.

Configurable bezels described herein may be scalable, using an adaptable base geometry such as an adaptable hexagonal grid system which may be manufactured in a large variety of colors, materials and finishes without compromising a functional assembly of the bezel.

In some embodiments, outserts are provided for mounting to a configurable bezel. The term outsert, as used herein, refers to a component which may be installed into the bezel from a front portion of a cover thereof into an opening formed in the base of the bezel. An outsert is generally designed with a housing that matches and fits into at least one opening or cell of the base of the bezel. Inserts, in comparison, may be installed in a bezel through a front or back thereof, and are not necessarily designed so as to conform to the edges or shape of an opening in the base of the bezel. Further details regarding inserts and outserts will be described below in conjunction with the figures. Inserts and outserts are examples of what are more generally referred to herein as "insertable components" illustratively configured in some embodiments for mounting to the base of a bezel.

An outsert may include a housing that is configured to snap fit or otherwise be mounted in an opening in a base portion of a bezel, such as in a hexagonal opening of a bezel which uses a hexagonal grid base geometry. The outsert may be configured to be mounted in a single opening, such as a single hexagonal opening, in the base of a bezel such as via a snap-in fit to a bezel that is attached to an electronic equipment chassis.

In some embodiments, outserts are used to signify secondary branding, as opposed to one or more inserts that signify primary branding. For example, an insert that is installed from a back portion of the bezel may be used to signify the manufacturer of a storage device or other component within an electronic equipment chassis. The insert may be mounted within the bezel prior to attachment of the bezel to the electronic equipment chassis. An outsert may be installed or mounted to the bezel from a front portion thereof, possibly after the bezel is attached to the electronic equipment chassis, and may be used to signify a particular product line of the manufacturer for the storage device or other component within the electronic equipment chassis. It is to be appreciated, however, that inserts and outserts are not limited to use in signifying primary and secondary branding, respectively. In other embodiments, inserts and outserts may be used to provide other identifiers or status information for components within the electronic equipment chassis. Inserts and outserts may be used to signify the type or capabilities of one or more components within the electronic equipment chassis, as well as status information related to such components. For example, inserts may be used to signify that the electronic equipment chassis includes storage devices of a particular type (e.g., disk storage, flash storage, etc.) while outserts may be used to signify information relating to such storage devices such as capacity, install date, etc.

In some embodiments, techniques are provided which enable the creation of a configurable bezel design that is highly customizable while retaining an underlying uniformity. The configurable bezel may subtly retain the underlying uniformity by utilizing a geometry of openings providing consistent visual aesthetics throughout the bezel. Some embodiments, as will be described in further detail below, utilize hexagonal shaped openings through the bezel design in an adaptable hexagonal grid system provided in a center portion of the base of a bezel. The base of the bezel, which includes the adaptable hexagonal grid system of openings, may be manufactured from a large variety of colors, materials and finishes. The base of the bezel serves as a mounting point for insertable components such as inserts, outserts, name plates, placards and other attachments configured for mounting to the base of the bezel.

Examples of configurable bezels will now be described with respect to the figures, in which like reference numerals denote similar elements.

FIG. 1 illustrates an exploded view of a configurable bezel 100. The bezel 100 includes a base 102, shown with a plurality of hexagonal openings arranged in a hexagonal grid. Also shown is a cover 104, for mounting to a front portion of the base 102. A locking mechanism 106 is provided for removably attaching the cover 104 to the base 102. The bezel 100 also includes an insert 108, which is configured for attachment to a back of the base 102 to fill hexagonal openings in the base 102. Also shown is a backing 110, which may be screwed into the base 102 to secure the insert 108 to the base 102. The backing 110, in some embodiments, provides an electromagnetic interference (EMI) shield, protecting one or more components installed in an electronic equipment chassis which the bezel 100 is attached to.

The bezel 100 also includes an outsert housing 112, along with a number of outsert covers 114. The outsert housing 112 is configured for mounting in one of the hexagonal openings of the base 102 via an aperture 122 formed in the cover 104. The outsert covers 114 have perforations which match a perforation pattern of the cover 104, such that when the outsert 112 is mounted to the base 102 through the aperture 122 and one of the outsert covers 114 is mounted thereto, the outsert cover 114 blends in with the cover 104 providing a seamless aesthetic design. Also shown is an outsert name plate 116, which is configured for mounting to the outsert housing 112 via a snap fit. The outsert name plate 116, as mentioned above, may provide secondary branding for a component installed within an electronic equipment chassis, relative to another name plate 118 which provides primary branding for the component installed within the electronic equipment chassis. In the FIG. 1 example, the name plate 118 signifies primary branding of EMC®, while the outsert name plate 116 provides secondary branding of Data Domain®, a storage product available from Dell EMC.

In some embodiments, the name plate 118 may be configured as an insert, in that it may be installed from the back of the cover 104 via aperture 124 (e.g., it may be disposed between the cover 104 and the base 102), whereas the outsert housing 112, outsert cover 114 and outsert name plate 116 are configured for installation from the front of the cover 104. In other embodiments, the name plate 118 may be configured as an insert that is installed from the front of the cover 104.

Also shown in FIG. 1 is an optional name plate 120, which may provide additional information regarding one or more components installed within an electronic equipment chassis that the bezel 100 is attached to. For example, the name plate 120 may provide a specific model or serial number. The name plate 120 may be configured for mounting to the outsert cover 114, or to a portion of the cover 104 as will be described in further detail below.

The bezel 100 includes a lock 126, accessible via an aperture 128 in the cover 104, for actuating the locking mechanism 106 to removably attach the cover 104 to the base 102. The lock 126 may include an associated lock cover 130, which has perforation matching that of the cover 102. "Mid ear" pockets 132 are also shown.

Figure 2:
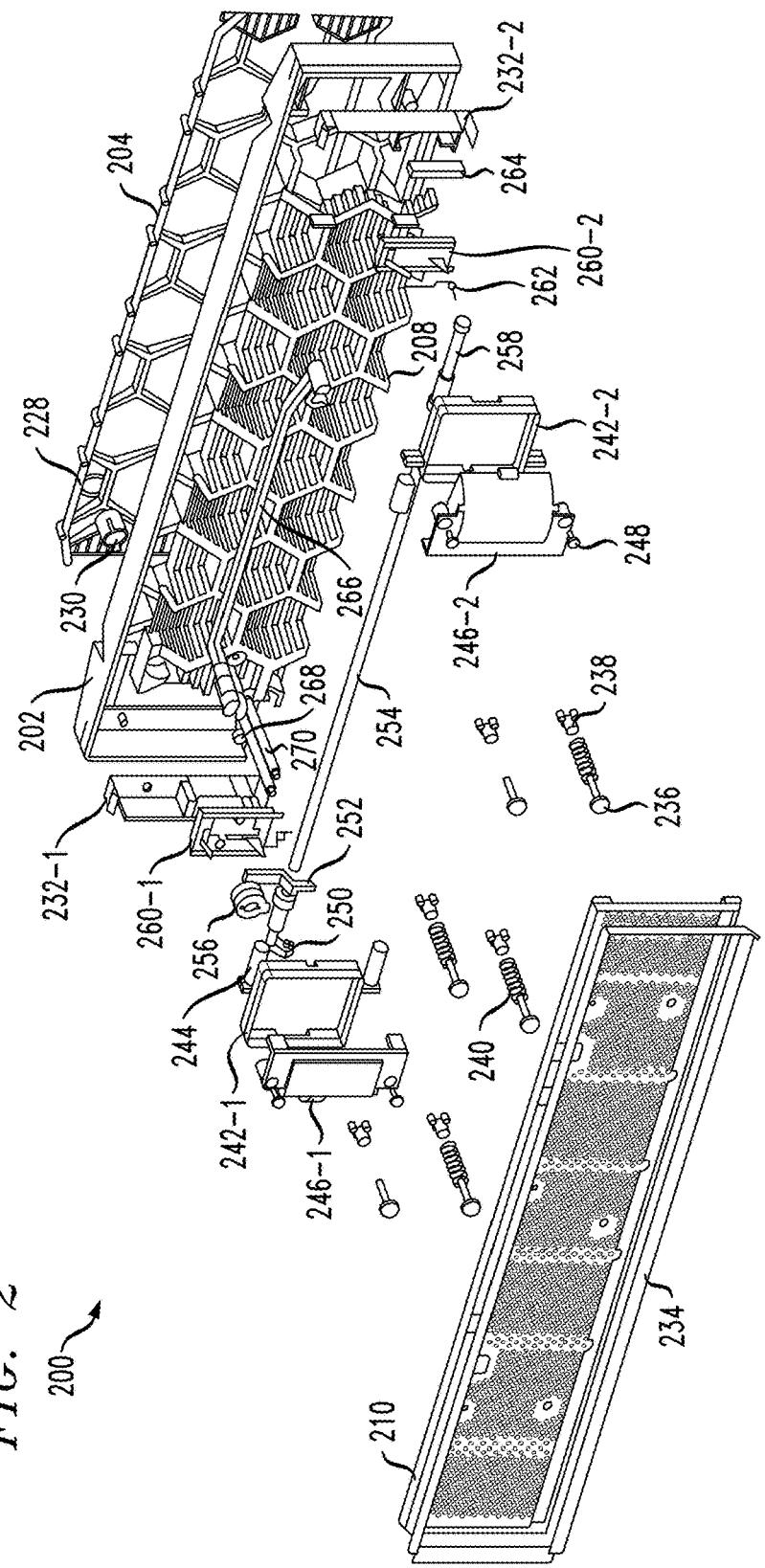
FIG. 2 shows an exploded view of another configurable bezel in an illustrative embodiment.

FIG. 2 shows an exploded view of a bezel 200. The bezel 200 includes backing 210. The backing 210 may provide a 2U EMI shield. Surrounding the backing 210 is a gasket 234. The gasket 234 may be a C-shaped EMI gasket that attaches to outer edges of the backing 210.

The bezel 200 includes a number of screws 236 for affixing the backing 210 to the base 202. Shield standoffs 238 may be provided for each of the screws 236 as shown. Springs 240 are shown for certain ones of the screws 236.

Latch slides 242-1 and 242-2 are shown, collectively referred to herein as latch slides 242. Each of the latch slides 242 includes a latch slide spring 244, although only one latch slide spring 244 for latch slide 242-1 is shown in FIG. 2 for clarity of illustration. Latch slide springs 244 may be dual torsion large pocket springs. Latch slides 242-1 and 242-2 are attached to door pockets 246-1 and 246-2, respectively. The door pockets 246-1 and 246-2, collectively referred to as door pockets 246, may be a standard form factor size, such as 2U, 3U, 4U, etc. The door pockets 246 are attached to the latch slides 242 via screws 248. The screws 248 may be screws with oval washers.

Lock pawl 250 is attached via lock link 252 to one end of lock lever rod 254. The lock pawl 250 may be actuated via lock pawl 256, accessible via aperture 228 in cover 204 via lock 230. The other end of lock lever rod 254 is attached to rod pawl 258. The lock link 252 may be a standard form factor size, such as a 2U lock link.

Doors 260-1 and 260-2, collectively referred to herein as doors 260, are configured for attachment to door pockets 246-1 and 246-2, respectively, via the screws 248. The doors 260 may be a standard form factor size such as 2U, 4U, etc. Door springs 262 are also provided. Although only one door spring 262 for door 260-2 is labeled in FIG. 2 for clarity of illustration, the door 260-1 may also have an associated door spring 262.

When assembled, the latch slides 242, latch slide springs 244, door pockets 248, screws 248, lock pawl 250, lock link 252, lock lever rod 254, lock pawl 256, rod pawl 258, doors 260 and door springs 262 collectively form a locking mechanism similar to the locking mechanism 106 of bezel 100.

Also included in bezel 200 are mid ear pockets 232-1 and 232-2, collectively referred to as mid ear pockets 232. The mid ear pockets 232 may be a standard form factor size, such as 2U mid ear pockets. The doors 260 may attach to the mid ear pockets 232, with the mid ear pockets 232 attaching to the base 202. Bumpers 264 may be provided between the doors 260 and the mid ear pockets 232. Although only one bumper 264 for door 260-2 is labeled in FIG. 2 for clarity of illustration, the door 260-1 may also have an associated bumper 264.

The bezel 200 further includes a holder 266. The holder 266 may be a standard form factor size, such as a 2U drive louver fiber optic holder. A collector 268 and cable 270 attach to the holder 266. The collector 268 may be a fiber optic collector with a 3 mm diameter. The cable 270 may be a fiber optic cable with a 4 mm diameter jacket and a 3 mm diameter core. The collector 268 and cable 270 may be connected with one or more components inside an electronic equipment chassis to which the bezel 200 is attached to provide backlighting of insert 208. The insert 208 may be a standard form factor size, such as a 2U louver bezel insert with 3 mm diameter fibers.

Base 202 of bezel 200 may be a standard form factor size, such as a 2U base for a bezel structure. The bezel 200 also includes cover or louver 204, which may also be a standard form factor size such as for a 2U louver facade.

Figure 3:
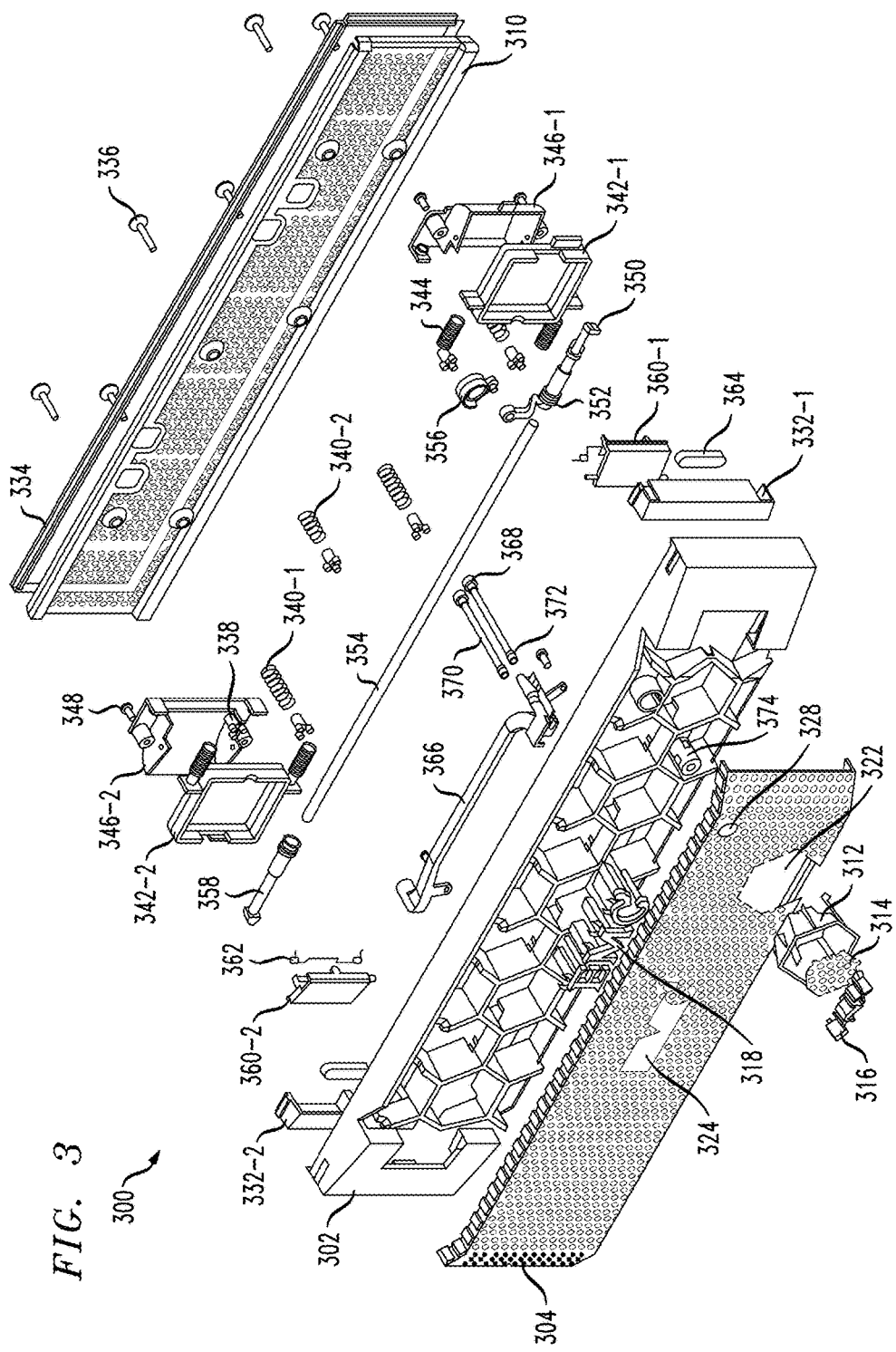
FIG. 3 shows an exploded view of another configurable bezel in an illustrative embodiment.

FIG. 3 shows an exploded view of a bezel 300. The bezel 300 includes base 302 and cover 304. The base 302 and cover 304 may be standard form factor sizes, similar to the base 202 and cover 204 of bezel 200. The cover 304 includes cutouts or apertures 322, 324 and 328. The aperture 322 provides a space for outsert housing 312, while the aperture 324 provides a space for insert 318 and the aperture 328 provides a space for a lock (not shown in FIG. 3 for clarity of illustration). The insert 318 in FIG. 3 provides a primary branding of "EMC" but it is to be appreciated that this is merely an example and that the insert 318 may provide a different branding or other identifier for components installed in an electronic equipment chassis to which the bezel 300 is attached. As shown in FIG. 3, the insert 318 is disposed between the cover 304 and the base 302, and may thus be configured to mount to the base 302 from behind the cover 304. In other embodiments, however, the insert 318 may be configured to mount to the base 302 from outside the cover 304 through the aperture 324. The insert 318 may have snap fit features for mounting to the base 302.

Outsert housing 312 is hexagonal-shaped, to match a corresponding hexagonal opening in the base 302. In FIG. 3, the base 302 includes a lock 374 for securing the outsert housing 312 to the base 302. The lock 374 may be a small barrel lock. Outsert cover 314 is provided for mounting to the outsert housing 312, and an outsert name plate or bridge 316 is provided for mounting to the outsert housing 312 over the outsert cover 314. The outsert cover 314 has a perforation which matches that of the cover 304. The outsert bridge 316 provides additional branding, illustratively for a VNX® storage product available from Dell EMC. Again, this branding is shown merely as an example, and embodiments are not limited to any particular branding or identifier.

The bezel 300 includes mid ear pockets 332-1 and 332-2, collectively referred to as mid ear pockets 332. Bumpers 364 are provided for cushioning between the mid ear pockets 332-1 and 332-2 and doors 360-1 and 360-2, respectively, although only one bumper 364 for door 360-1 is labeled in FIG. 3 for clarity of illustration. Door springs 362 are provided for each of the doors 360, although only a single door spring 362 for door 360-2 is labeled in FIG. 3 for clarity of illustration.

A holder 366 is provided for bezel 300. Collectors 368, cables 370 and collars 372 are provided, although only single instances are labeled in FIG. 3 for clarity of illustration. The collectors 368 may be fiber optic collectors with 3 mm diameter, the cables 370 may be fiber optic cables with 4 mm diameter jackets and 3 mm diameter cores, and the collars 372 may be fiber optic collars. The collectors 368, cables 370 and collars 372 connect to the holder 366 and to one or more components of an electronic equipment chassis that the bezel 300 is attached to, and may provide backlighting of the insert 318 or other portions of the cover 304.

The bezel 300 has a locking mechanism including lock pawl 350 attached via lock link 352 to one end of lock lever rod 354, with the other end of lock lever rod 354 being attached to rod pawl 358. The lock pawl 350 may be actuated via lock pawl 356, accessible via aperture 328 in cover 304. The locking mechanism of bezel 300 also includes latch slides 342-1 and 342-2, collectively referred to as latch slides 342. A latch slide spring 344 is provided for each latch slide 342, although only one latch slide spring 344 for latch slide 342-1 is labeled in FIG. 3 for clarity of illustration. The locking mechanism of bezel 300 further includes door pockets 346-1 and 346-2, collectively referred to as door pockets 346. The door pockets 346 may be affixed to the doors 360 via screws 348. One or more of the screws 348 and screws 336 may have associated shield standoffs 338.

Screws 336 are used to affix backing 310 to the base 302. Different ones of the screws 336 may have associated springs 340-1 and 340-2 of varying lengths. A gasket 334 surrounds the backing 310.

Figure 4A:
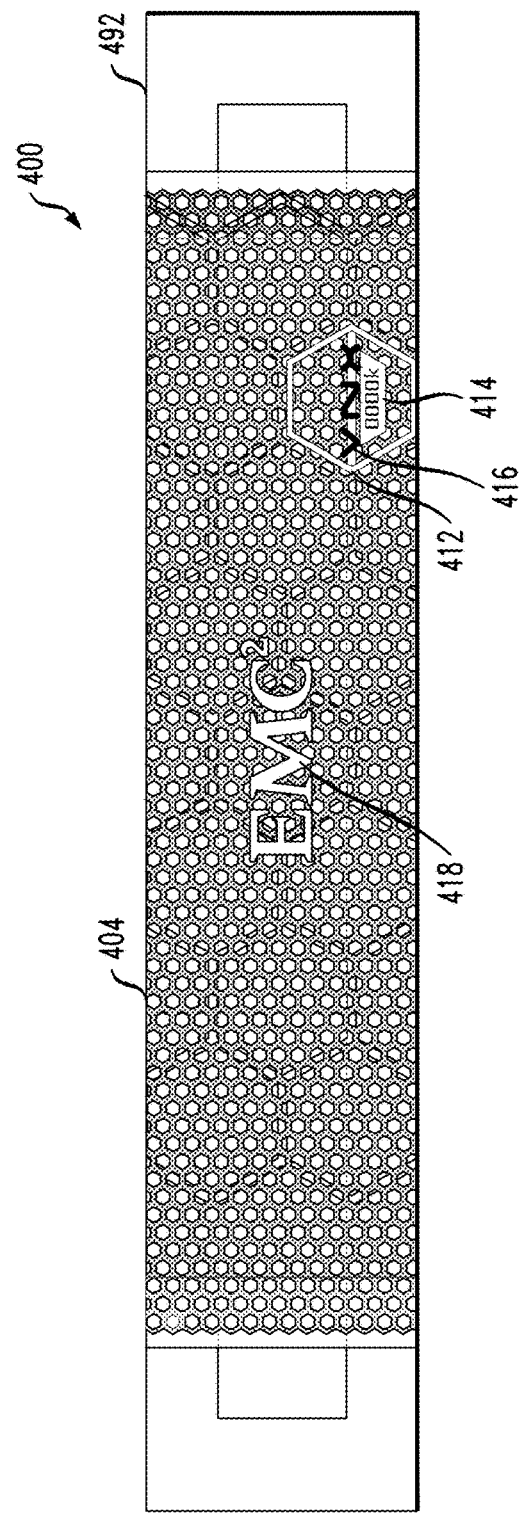
FIG. 4A shows a configurable bezel installed in an electronic equipment chassis in an illustrative embodiment.

FIG. 4A illustrates a bezel 400 installed in an electronic equipment chassis 492. The bezel 400 includes a cover 404, an insert 418, an outsert housing 412, an outsert cover 414 and an outsert name plate 416. The insert 418 provides a primary branding of EMC² with the outsert name plate 416 providing secondary branding of VNX and the outsert cover 414 having a name plate denoting a model number 0000k. It is to be appreciated that these primary and secondary brandings, as well as the model number, are shown by way of example only and that embodiments are not limited to use with the particular brandings or model numbers shown. In addition, while the insert 418 and outsert name plate 416 in FIG. 4A show brandings, they may alternatively provide other types of identifiers or status information for components installed in an electronic equipment chassis.

Figure 4B:
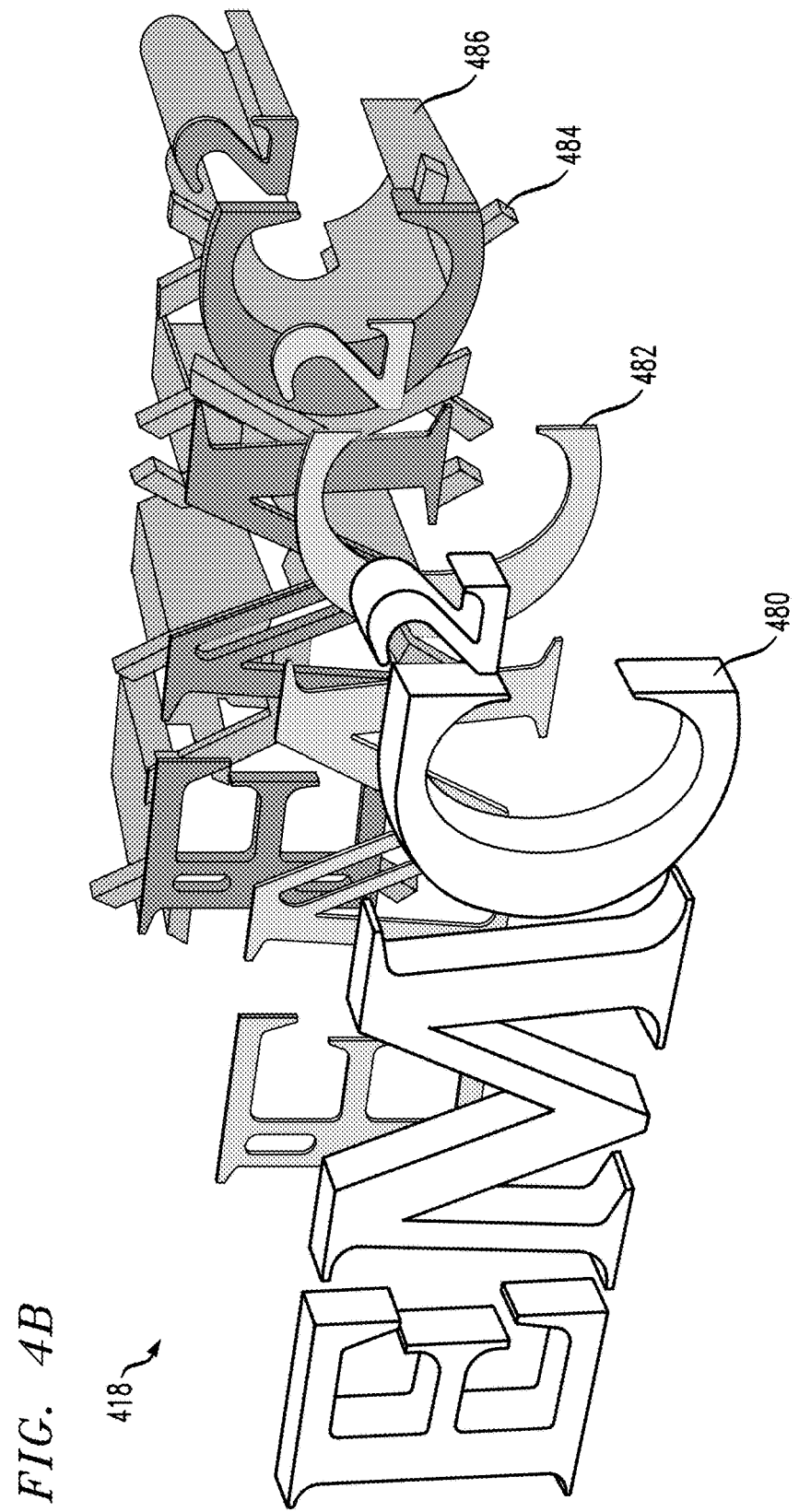
FIG. 4B shows a close-up exploded view of an insert in the configurable bezel of FIG. 4A in an illustrative embodiment.

FIG. 4B shows an exploded view of the insert 418. The insert 418 includes a facade 480, an adhesive 482, and insert resins 484 and 486. The facade 480 may, for example, have a bright chrome finish, with the insert resin 484 having a high gloss black finish and the insert resin 486 having a blue finish. The particular color and type of finishes may vary as desired for a particular branding or other identifier provided by the insert 418. The adhesive 482 is used to affix the facade 480 to the insert resins 484 and 486. In some embodiments, the adhesive 482 is a double sided tape. Various other types of adhesives may be used in other embodiments.

Figure 4C:
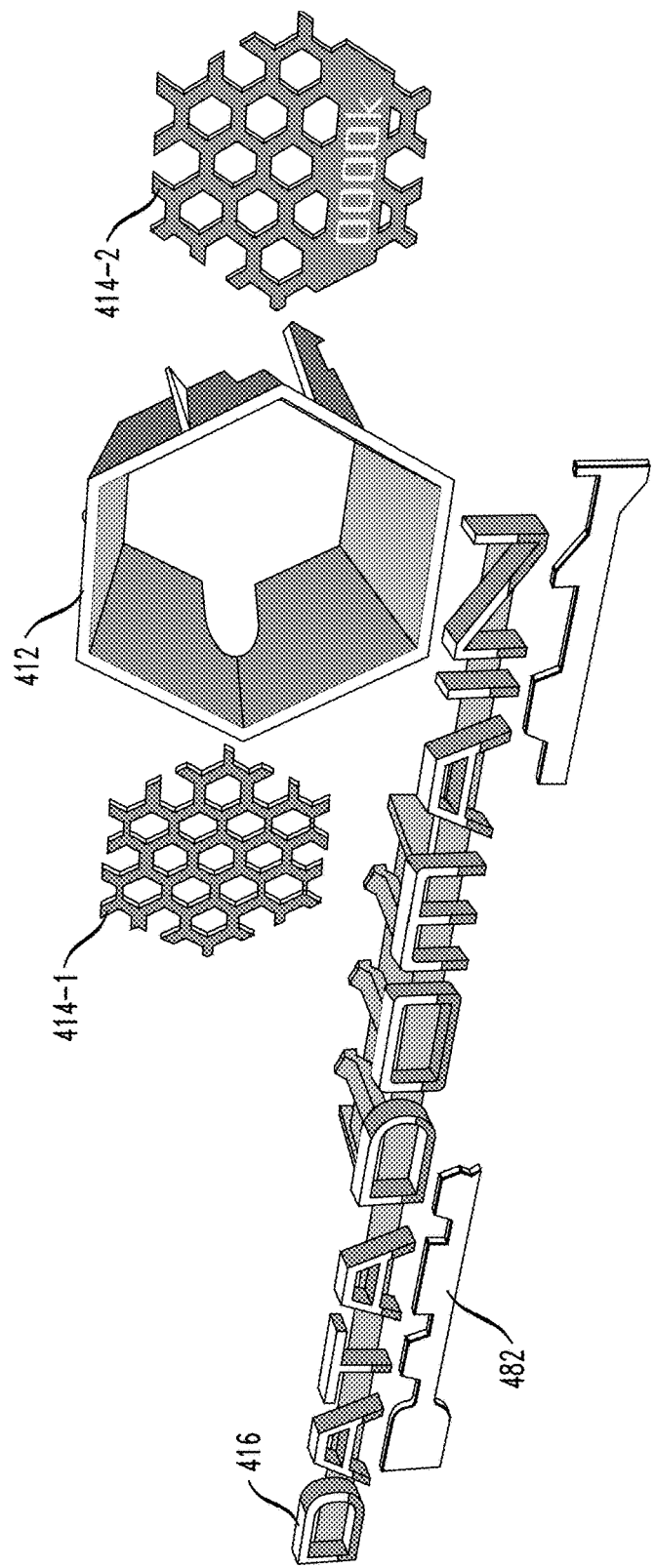
FIG. 4C shows a close-up exploded view of an outsert in the configurable bezel of FIG. 4A in an illustrative embodiment.

FIG. 4C shows an exploded view of the outsert housing 412. As shown in the FIG. 4C, the outsert cover 414 includes a first outsert cover 414-1 configured for mounting to a rear portion of the outsert housing 412 (e.g., closer to the base of the bezel 400 than the cover 404 of the bezel 400) and a second outsert cover 414-2 configured for mounting to a front portion of the outsert housing 412 (e.g., closer to the cover 404 of the bezel 400 than a base of the bezel 400). The outsert housing 412 may have a blue finish, while the outsert covers 414-1 and 414-2 may have black finishes. The outsert cover 414-1 may have a low gloss black finish while the outsert cover 414-2 has a high gloss black finish with silver lettering for the model number silkscreened thereto.

The outsert name plate 416 is configured for mounting to the outsert housing 412, such as via snap fit features. While FIG. 4A shows an outsert name plate 416 with the branding VNX, FIG. 4C shows the outsert name plate 416 with branding Data Domain, illustrating the modular nature of the bezel 400. FIG. 4C also shows adhesive 482, which may be used to affix portions of the outsert name plate 416 which extend beyond edges of the outsert housing 412 to a front surface of the cover 404.

Different outsert name plates 416 may be mounted to the same outsert housing 412, such as the different outsert name plates shown in FIGS. 4A and 4C, providing flexibility for designers. For example, significant time and effort may be expended in designing a new product, such as a new storage device. Configurable bezels as described herein provide flexibility to the designer, in that brand names or other identifiers of the storage products may be decided later during design and development of the new product, as the same configurable bezel may be used while only requiring production of an outsert name plate once a name or other branding or identifier of the new product is chosen. This allows for streamlining the design and development process, giving flexibility for the designer to change the branding or identifier of the outsert name plates later in the design and development process without delaying rollout of a new product.

Figure 5A:
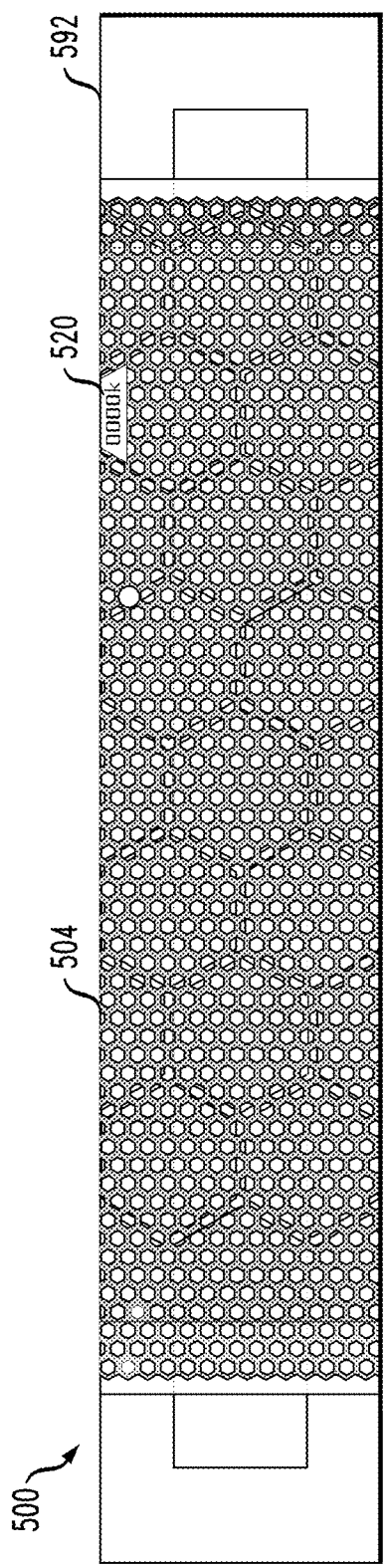
FIG. 5A shows another configurable bezel installed in an electronic equipment chassis in an illustrative embodiment.
Figure 5B:
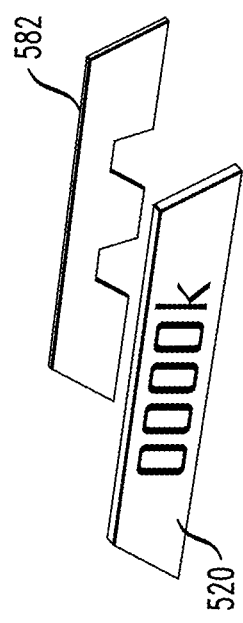
FIG. 5B shows a close-up exploded view of a name plate in the configurable bezel of FIG. 5A in an illustrative embodiment.

FIG. 5A shows another bezel 500 installed in an electronic equipment chassis 592. The bezel 500 includes a name plate 520 affixed to a cover 504 of the bezel 500. The name plate 520 illustratively shows a model number 0000k, although various other information or identifiers may be provided by the name plate 520 in other embodiments. FIG. 5B shows an exploded view, illustrating the name plate 520 and an adhesive 582 used to affix the name plate 520 to the front surface of the cover 504. The name plate 520 may have a high gloss black finish, with the model number in silver silkscreened onto the surface of the name plate 520.

Figure 6A:
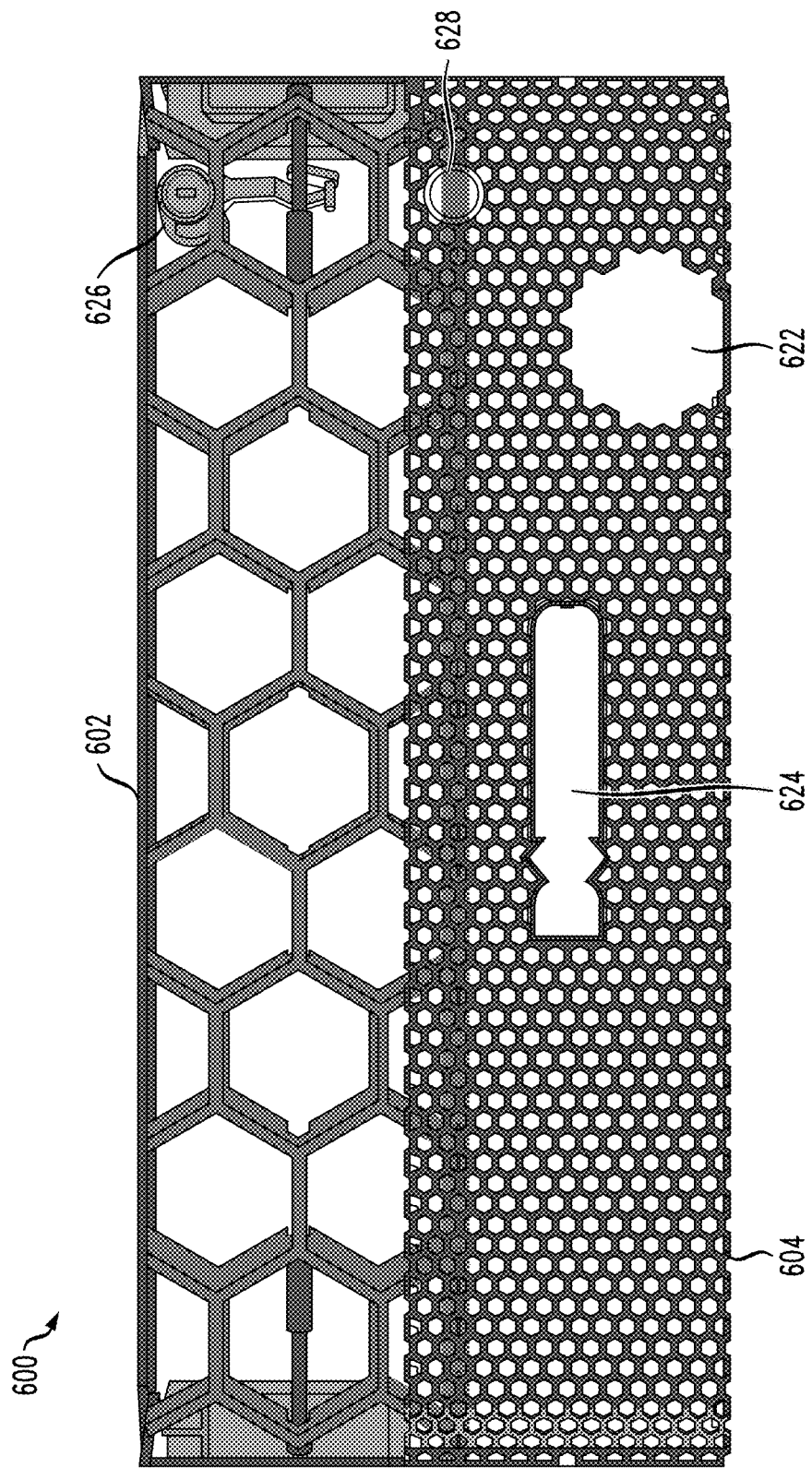
FIG. 6A shows an exploded view of another configurable bezel in an illustrative embodiment.

FIG. 6A shows an exploded view of a bezel 600, including a base 602 and a cover 604. The cover 604 includes apertures 622, 624 and 628. The aperture 622 is a cutout for an outsert housing 612 (shown in FIG. 6C), which is a hexagonal shape matching an opening in the base 602. The aperture 624 is a cutout for an insert 618 (shown in FIG. 6C). The aperture 628 is for a lock 626, shown in more detail in FIG. 6B.

Figure 6B:
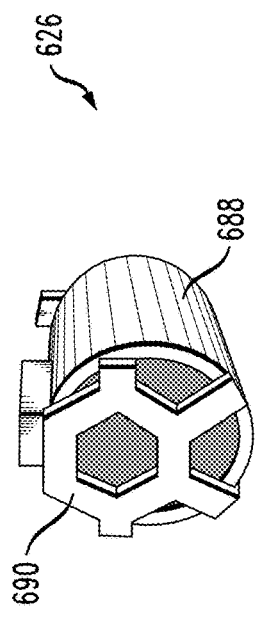
FIG. 6B shows a close-up view of a lock of the base of the configurable bezel of FIG. 6A in an illustrative embodiment.

FIG. 6B shows a close-up exploded view of the lock 626, which includes a lock plug 688 and a lock plug cover 690. The lock plug cover 690 has a perforation matching the perforation of cover 604.

Figure 6C:
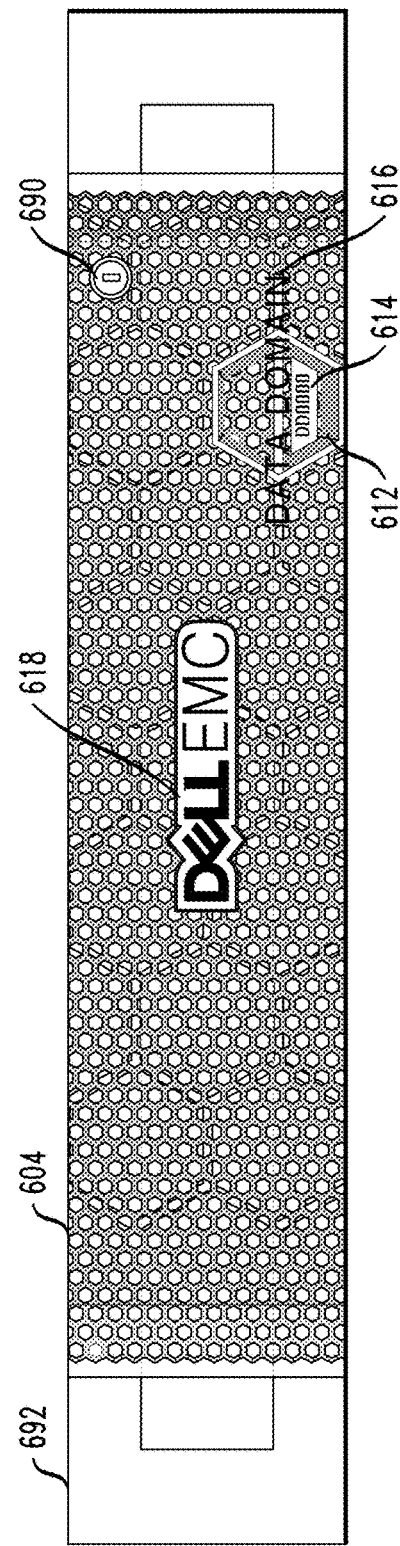
FIG. 6C shows the configurable bezel of FIG. 6A installed in an electronic equipment chassis in an illustrative embodiment.

FIG. 6C shows the bezel 600 attached to an electronic equipment chassis 692. Insert 618 is visible through aperture 624, and outsert housing 612, outsert cover 614 and outsert name plate 616 are visible through aperture 622. Also shown is lock plug cover 690 visible through aperture 628. The insert 618 includes the branding Dell EMC, while the outsert name plate 616 shows branding Data Domain and the outsert cover 614 includes model number information DD0000.

Figure 6D:
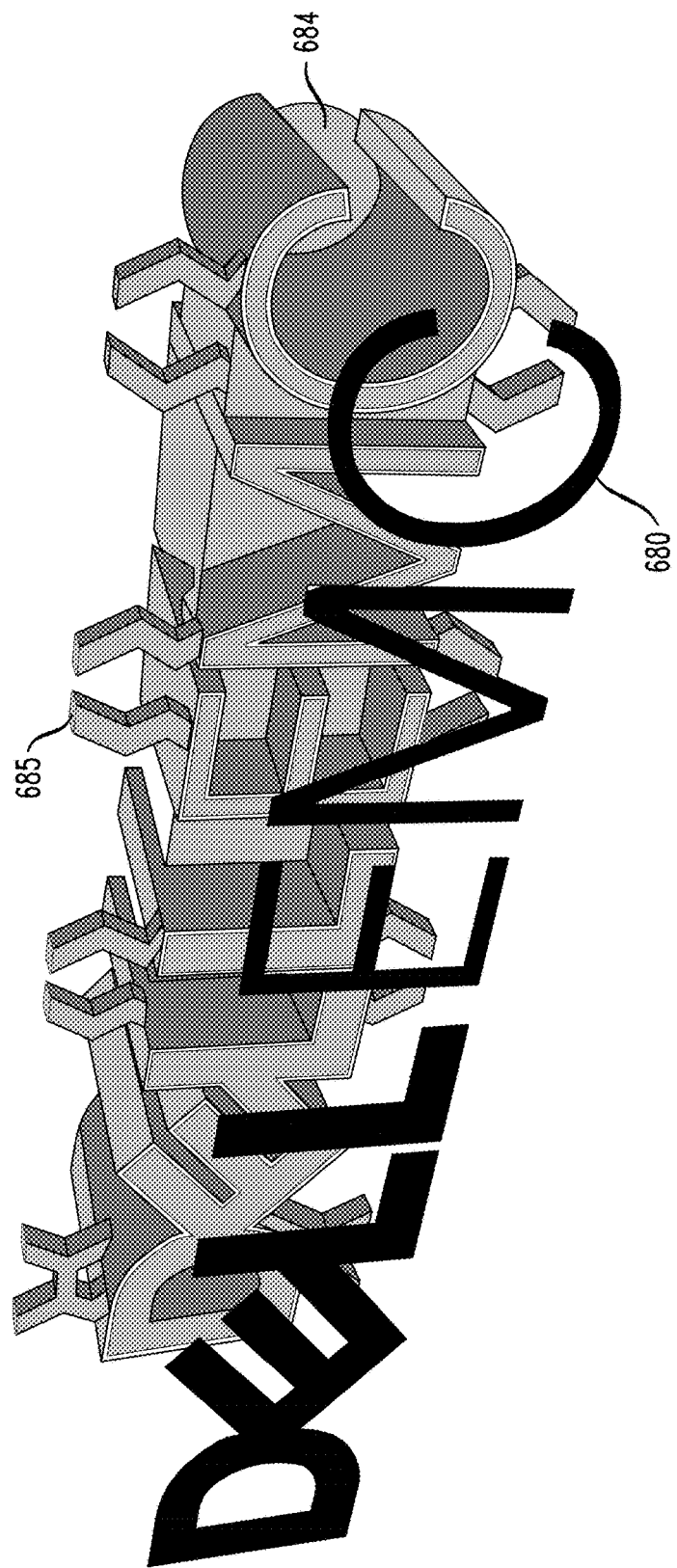
FIG. 6D shows a close-up exploded view of an insert of the configurable bezel installed in the electronic equipment chassis shown in FIG. 6C in an illustrative embodiment.

FIG. 6D shows a close-up exploded view of the insert 618, which includes a facade 680 and a backing 684. The facade 680 may provide a logo in metallic letters with a chrome finish. The backing 684 may have a high gloss black finish. The backing 684 includes a number of snap fit features 685, although only one is labeled for clarity of illustration, for attachment of the insert 618 to the bezel 600. The facade 680 may be affixed to the backing 684 via an adhesive, such as in the manner described above with respect to FIG. 4B.

Figure 6E:
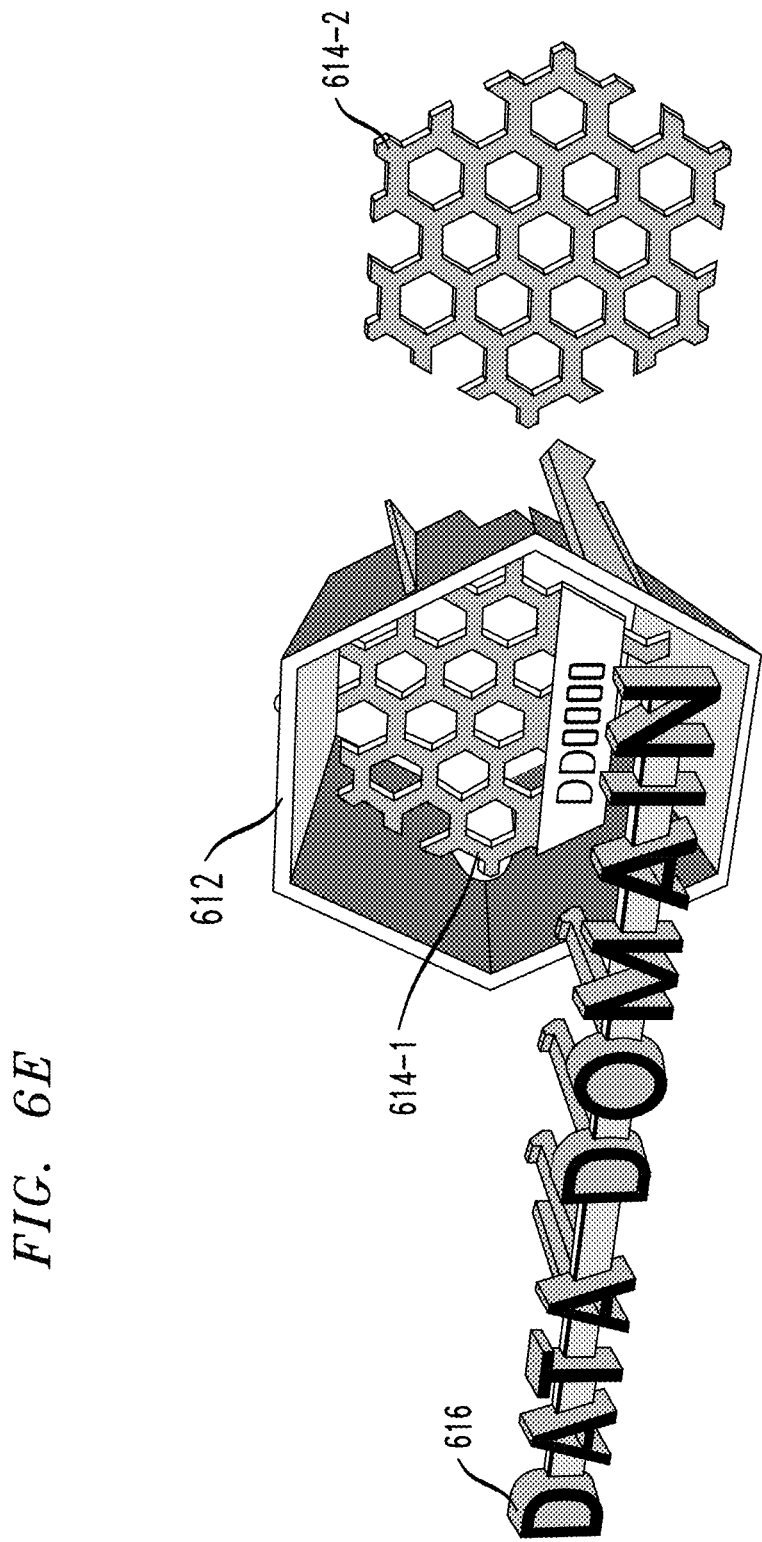
FIG. 6E shows a close-up exploded view of an insert of the configurable bezel installed in the electronic equipment chassis shown in FIG. 6C in an illustrative embodiment.

FIG. 6E shows a close-up exploded view of the outsert housing 612, outsert covers 614-1 and 614-2 and outsert name plate 616. The outsert housing 612 may have a blue finish, while the outsert covers 614-1 and 614-2 include perforations matching the perforations of cover 604. The outsert cover 614-1 includes a name bridge with silver letters silkscreened thereon. The outsert name plate 616 includes a name bridge with silver lettering on a high gloss black backing. The silver lettering of the name bridge may be affixed to the backing via an adhesive, in a manner similar to that described above with respect to FIG. 4B.

Figure 7A:
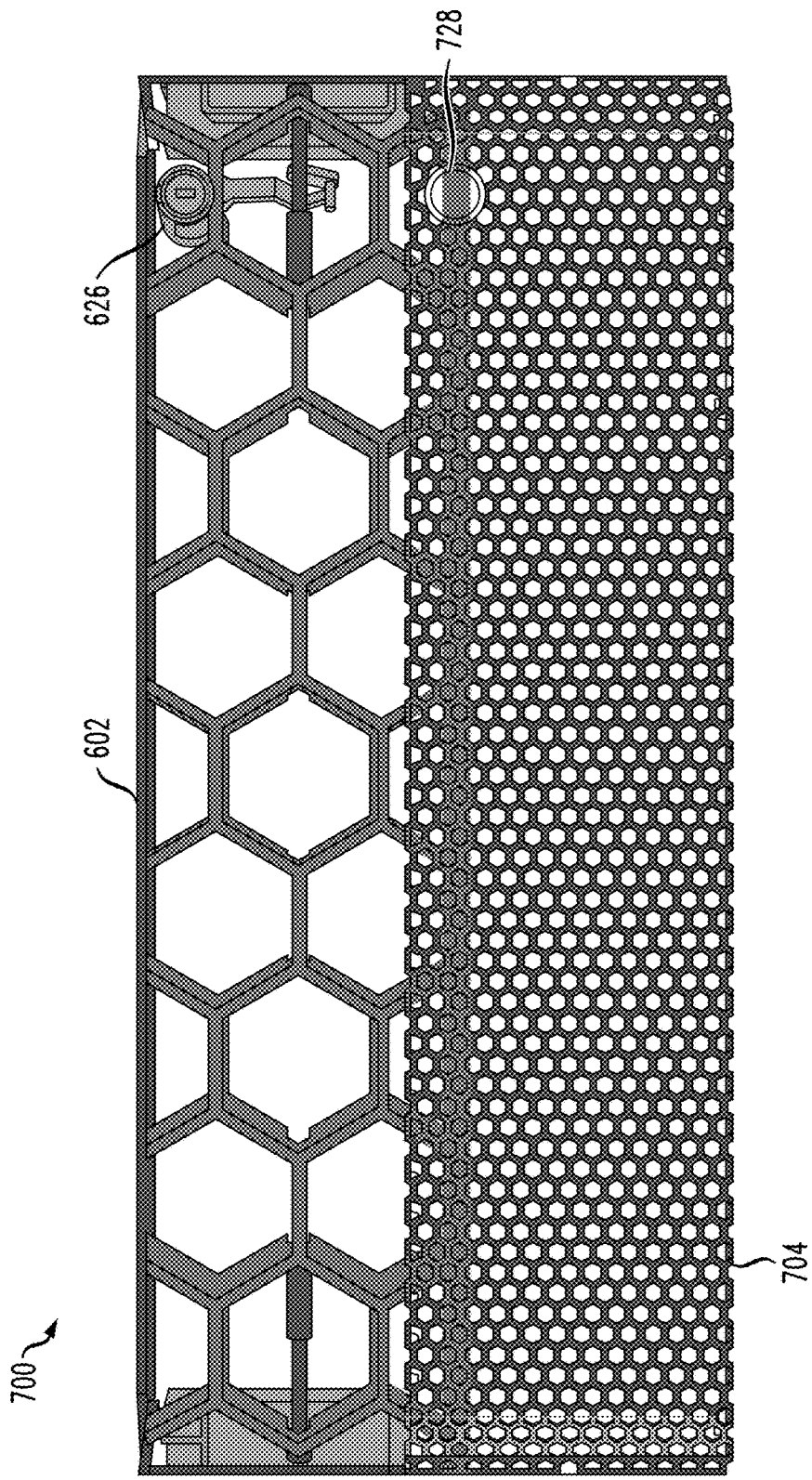
FIG. 7A shows an exploded view of another configurable bezel in an illustrative embodiment.

FIG. 7A shows a bezel 700, similar to the bezel 600 but without cutouts or apertures for an insert or outsert housing. The bezel 700 includes the same base 602 as bezel 600 including lock 626. The bezel 700, however, includes a different cover 704 relative to the bezel 600. The cover 704 includes an aperture 728 for accessing the lock 626.

Figure 7B:
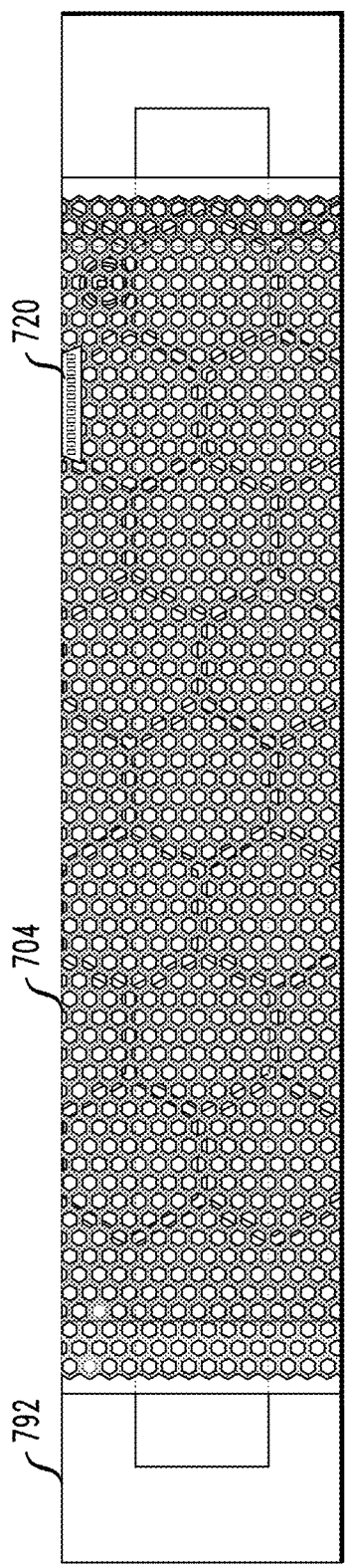
FIG. 7B shows the configurable bezel of FIG. 7A installed in an electronic equipment chassis in an illustrative embodiment.
Figure 7C:
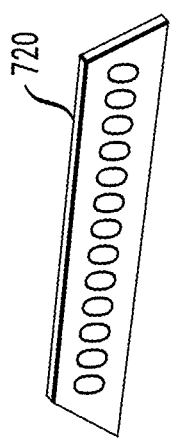
FIG. 7C shows a close-up view of a name plate of the configurable bezel installed in the electronic equipment chassis of FIG. 7B in an illustrative embodiment.

FIG. 7B shows the bezel 700 attached to an electronic equipment chassis 792. As shown, a name plate 720 is affixed to a front of the cover 704 of bezel 700. The name plate includes model number information. FIG. 7C shows a close-up view of the name plate 720, which may be affixed to the front of the cover 704 via an adhesive in a manner similar to that described above with respect to FIG. 5B.

Figure 8A:
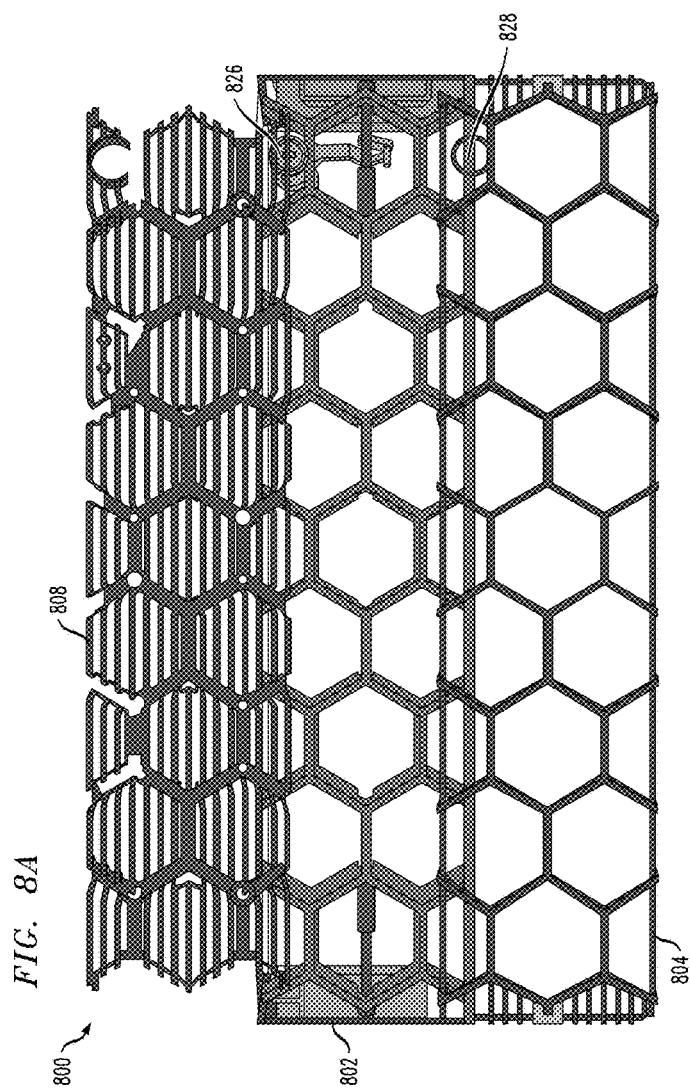
FIG. 8A shows an exploded view of another configurable bezel in an illustrative embodiment.

FIG. 8A shows a bezel 800, which includes a base 802 similar to the base 602 of bezel 600 and the base 702 of bezel 700, but which utilizes a different cover. The bezel 800 further indicates the configurable or modular nature of the bezels disclosed herein, as a common base such as base 602/702/802 may be used to form various different types of bezels.

Figure 8B:
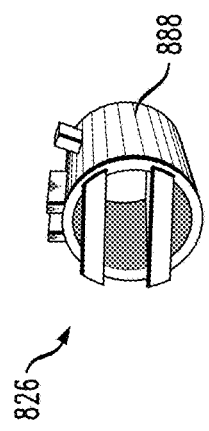
FIG. 8B shows a close-up view of a lock of the base of the configurable bezel of FIG. 8A in an illustrative embodiment.

The bezel 800 includes base 802, which may have black edges but with a blue hexagonal grid structure in its center portion. The bezel 800 further includes a cover 804 with a number of hexagonal apertures matching the hexagonal grid structure of the base 802, along with an aperture 828 for lock 826. The bezel 800 further includes in insert 808, which may be disposed between the cover 804 and base 802 that is secured by the lock 826. FIG. 8B shows a close-up view of the lock 826 including a lock plug 888.

Figure 8C:
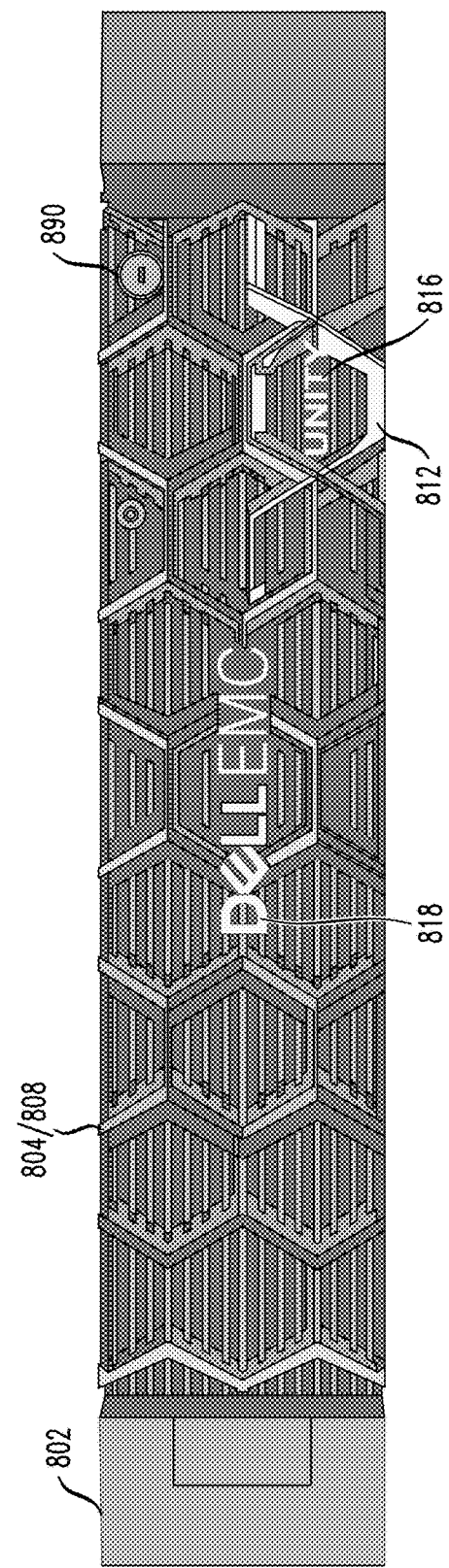
FIG. 8C shows the configurable bezel of FIG. 8A installed in an electronic equipment chassis in an illustrative embodiment.

FIG. 8C shows the bezel 800 attached to an electronic equipment chassis 892. An insert 818 is visible through apertures in the cover 804 and in front of insert 808. Outsert housing 812 is shown, along with outsert name plate 816. Insert 818 provides primary branding Dell EMC, while outsert name plate 816 shows secondary branding Unity. Also shown is a lock plug cover 890, which may cover the lock plug 888 of lock 826.

Figure 8D:
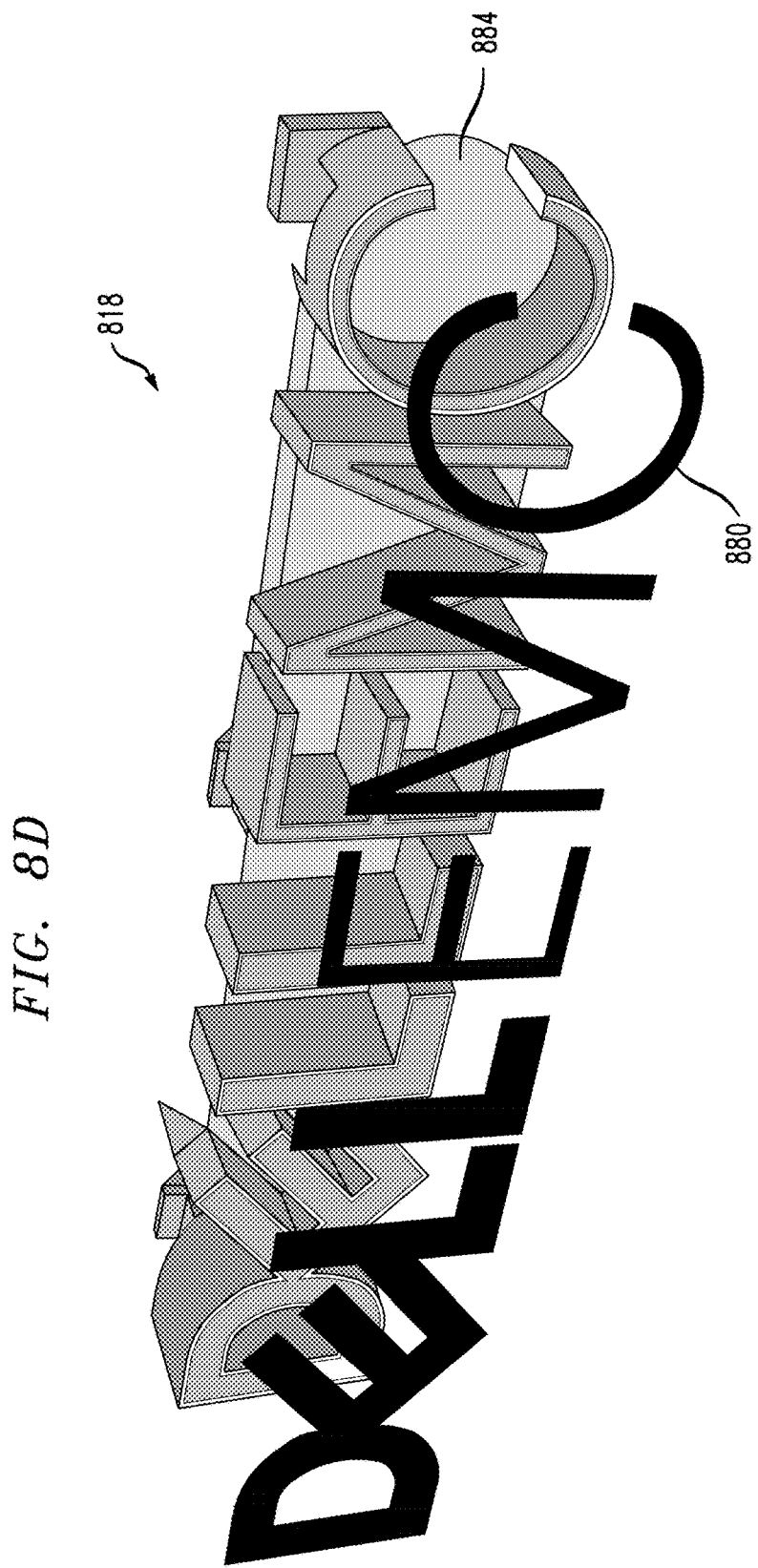
FIG. 8D shows a close-up exploded view of an insert of the configurable bezel installed in the electronic equipment chassis shown in FIG. 8C in an illustrative embodiment.

FIG. 8D shows a close-up exploded view of the insert 818, which includes a facade 880 and a backing 884. The facade 880 may provide a logo in metallic letters with a chrome finish. The backing 884 may have a high gloss black finish. The backing 884 may include snap fit features for attachment of the insert 818 to the bezel 800. The facade 880 may be affixed to the backing 884 via an adhesive, such as in the manner described above with respect to FIG. 4B.

Figure 8E:
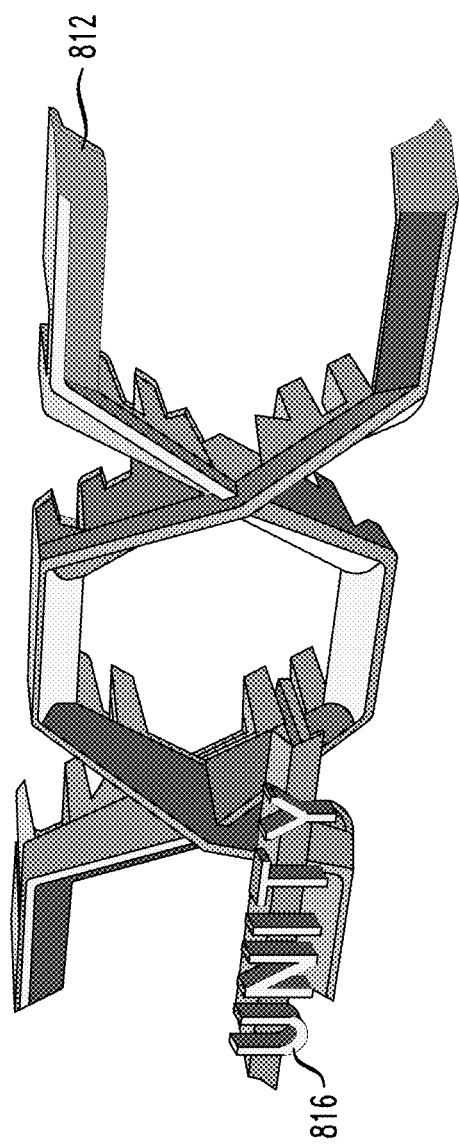
FIG. 8E shows a close-up exploded view of an insert of the configurable bezel installed in the electronic equipment chassis shown in FIG. 8C in an illustrative embodiment.

FIG. 8E shows a close-up exploded view of the outsert housing 812 and outsert name plate 816. The outsert housing 812 of bezel 800 does not have an outsert cover, as the insert 808 fills in openings in the hexagonal grid of base 802 behind the cover 804. The outsert housing 812 may be two-tone color, blue and silver. The outsert name plate 816 may be affixed to the outsert housing 812 via snap fit features.

Figure 9:
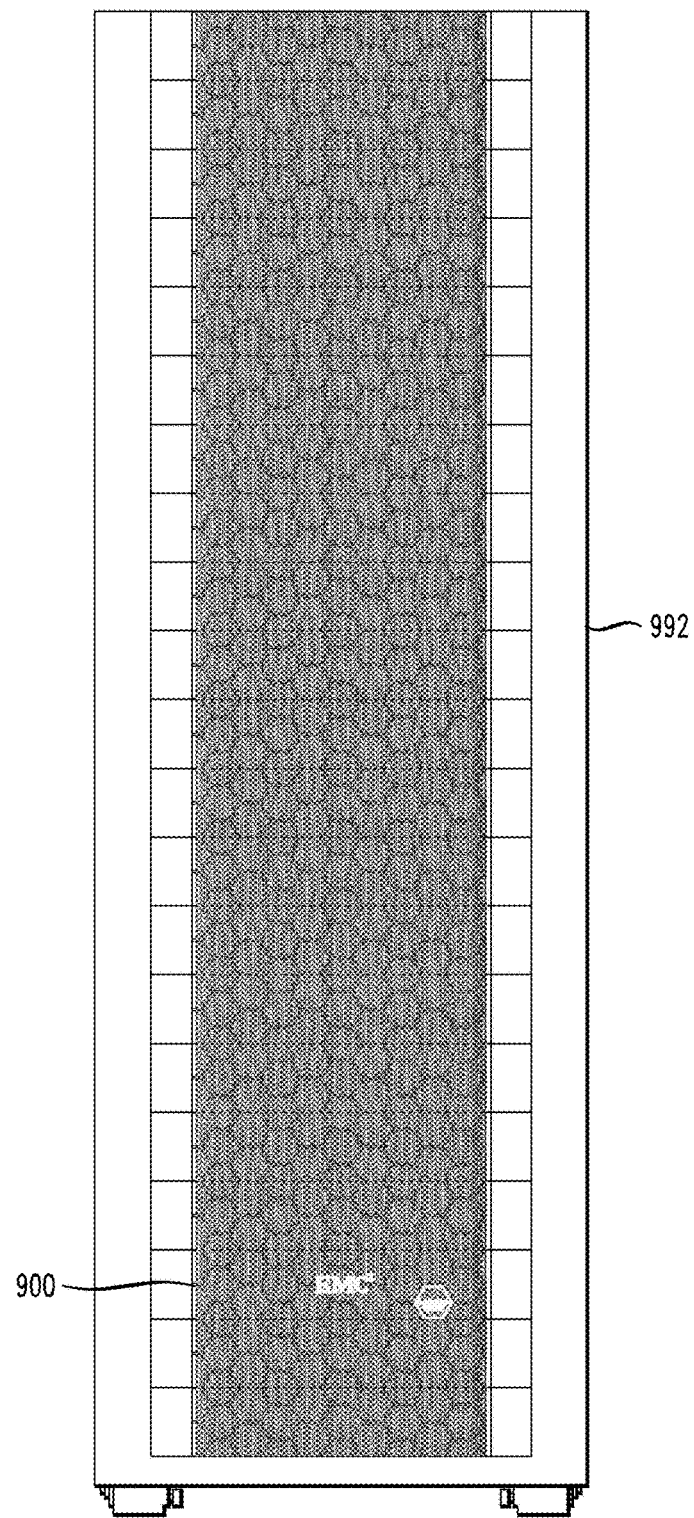
FIG. 9 shows an electronic equipment chassis with a configurable bezel attached thereto in an illustrative embodiment.

FIG. 9 shows a bezel 900 installed in electronic equipment chassis 992. The electronic equipment chassis 992 may be part of an electronic equipment rack that includes multiple instances of electronic equipment chassis 992. The bezel 900 is more particularly an example of the bezel 400 shown in FIG. 4A.

In some embodiments, a bezel comprises a base, a cover and at least one insertable component. The base comprises a plurality of openings. The cover is configured for mounting to a front of the base, and the cover comprises at least a first aperture. When the cover is mounted to the base, the first aperture aligns with at least a first one of the plurality of openings in the base. The at least one insertable component is configured for mounting to the base in the first opening through the first aperture of the cover. The bezel is configured for attachment to a front portion of an electronic equipment chassis.

The plurality of openings in the base may comprise hexagonal openings arranged in a hexagonal grid. Various other arrangements of openings may be used, including openings of different shapes, such as circles, squares or other rectangles, or other types of polygonal openings arranged in other types of polygonal grids.

The at least one insertable component in some embodiments comprises a first insert configured for mounting to the first opening of the base and a second insert configured for mounting to a back of the base. The first insert is disposed between the front of the base and the cover, and the first insert is visible through the first aperture of the cover that is aligned with the first opening of the base when the cover is mounted to the base. The second insert is configured to fill at least one additional opening of the base other than the first opening. The bezel may further include a backlight configured to illuminate at least a portion of the first insert.

In some embodiments, the bezel includes a locking mechanism configured to removably attach the cover to the base. The cover may comprise an additional aperture, and the locking mechanism may comprise a lock pawl accessible via the additional aperture of the cover for removably attaching the cover to the base.

The bezel may further comprise a backing configured for mounting to a back of the base. The backing may comprise or provide an EMI shield.

In some embodiments, the at least one insertable component comprises an outsert. The outsert comprises an outsert housing configured to mount to the first opening of the base, an outsert cover configured to mount to an opening of the outsert housing, and a name plate configured for insertion into the outsert housing over the outsert cover. The outsert cover may have a perforation pattern matching a perforation pattern of at least a portion of the cover surrounding the first aperture. At least a portion of the name plate extends past at least one edge of the first opening of the base to at least a portion of the cover.

The bezel may be configured with a designated standard form factor for attachment to the front portion of the electronic equipment chassis.

In some embodiments, the at least one insertable component comprises a name plate configured to display an identifier of at least one component installed in the electronic equipment chassis.

In some embodiments, a method comprises configuring a bezel to include a base comprising a plurality of openings, mounting a cover to the base of the bezel, the cover comprising at least a first aperture aligned with a first one of the plurality of openings of the base when the cover is mounted to the base, mounting at least one insertable component to the base in the first opening through the first aperture of the cover, and attaching the bezel to a front portion of an electronic equipment chassis. The plurality of openings in the base may comprise hexagonal openings arranged in a hexagonal grid.

Mounting the at least one insertable component may comprise mounting a first insert to the first opening of the base and mounting a second insert to a back of the base. The first insert is disposed between the front of the base and the cover, the first insert being visible through the first aperture of the cover that is aligned with the first opening of the base when the cover is mounted to the base. The second insert is configured to fill at least one additional opening of the base other than the first opening.

In some embodiments, an electronic equipment chassis comprises a chassis housing having a front portion and a rear portion and a bezel configured for attachment to the front portion of the chassis. The bezel may be configured as described above. An electronic equipment rack may comprise at least one electronic equipment chassis having the bezel.

It should therefore again be emphasized that the arrangements shown in the illustrative embodiments of FIGS. 1 through 9 are presented by way of example for purposes of illustration only, and alternative embodiments can utilize a wide variety of other types of bezels, bases, covers, insertable components, etc. Accordingly, the particular configurations of components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A bezel comprising:
   a base, the base comprising a plurality of openings, two or more of the plurality of openings each having a same size and a same shape;
   a cover configured for mounting to a front of the base, the cover comprising at least a first aperture, the first aperture being aligned with at least a first one of the two or more openings of the base when the cover is mounted to the base; and
   at least one insertable component configured for mounting to the base in the first opening through the first aperture of the cover;
   wherein the bezel is configured for attachment to a front portion of an electronic equipment chassis; and
   wherein the at least one insertable component comprises at least one of an outsert, an insert and a name plate.

2. The bezel of claim 1 wherein the plurality of openings in the base comprise hexagonal openings arranged in a hexagonal grid.

3. The bezel of claim 1 wherein the at least one insertable component comprises a first insert configured for mounting to the first opening, the first insert being disposed between the front of the base and the cover, the first insert being visible through the first aperture of the cover that is aligned with the first opening of the base when the cover is mounted to the base.

4. The bezel of claim 3 wherein the at least one insertable component further comprises a second insert configured for mounting to a back of the base, the second insert being configured to fill at least one additional opening of the base other than the first opening.

5. The bezel of claim 3 further comprising a backlight configured to illuminate at least a portion of the first insert.

6. The bezel of claim 1 further comprising a locking mechanism configured to removably attach the cover to the base.

7. The bezel of claim 6 wherein the cover comprises an additional aperture, and the locking mechanism comprises a lock pawl accessible via the additional aperture of the cover for removably attaching the cover to the base.

8. The bezel of claim 1 further comprising a backing configured for mounting to a back of the base, the backing comprising an electromagnetic interference (EMI) shield.

9. The bezel of claim 1 wherein the at least one insertable component comprises the outsert, the outsert comprising:
   an outsert housing configured to mount to the first opening of the base;

an outsert cover configured to mount to an opening of the outsert housing; and the name plate configured for insertion into the outsert housing over the outsert cover.

10. The bezel of claim 9 wherein the outsert cover has a perforation pattern matching a perforation pattern of at least a portion of the cover surrounding the first aperture.

11. The bezel of claim 9 wherein at least a portion of the name plate extends past at least one edge of the first opening of the base to at least a portion of the cover.

12. The bezel of claim 1 wherein the base is configured with a designated standard form factor for attachment to the front portion of the electronic equipment chassis.

13. The bezel of claim 1 wherein the at least one insertable component comprises the name plate configured to display an identifier of at least one component installed in the electronic equipment chassis.

14. A method comprising:
configuring a bezel to include a base comprising a plurality of openings, two or more of the plurality of openings each having a same size and a same shape;
mounting a cover to a front of the base of the bezel, the cover comprising at least a first aperture aligned with a first one of the two or more openings of the base when the cover is mounted to the base;
mounting at least one insertable component to the base in the first opening through the first aperture of the cover; and
attaching the bezel to a front portion of an electronic equipment chassis;
wherein the at least one insertable component comprises at least one of an outsert, an insert and a name plate.

15. The method of claim 14 wherein the plurality of openings in the base comprise hexagonal openings arranged in a hexagonal grid.

16. The method of claim 14 wherein mounting the at least one insertable component comprises:
mounting a first insert to the first opening of the base, the first insert being disposed between the front of the base and the cover, the first insert being visible through the first aperture of the cover that is aligned with the first opening of the base when the cover is mounted to the base; and
mounting a second insert to a back of the base, the second insert being configured to fill at least one additional opening of the base other than the first opening.

17. An electronic equipment chassis comprising:
a chassis housing having a front portion and a rear portion; and
a bezel configured for attachment to the front portion of the chassis, the bezel comprising:
a base, the base comprising a plurality of openings, two or more of the plurality of openings each having a same size and a same shape;
a cover configured for mounting to a front of the base, the cover comprising at least a first aperture, the first aperture being aligned with at least a first one of the two or more openings of the base when the cover is mounted to the base; and
at least one insertable component configured for mounting to the base in the first opening through the first aperture of the cover;
wherein the at least one insertable component comprises at least one of an outsert, an insert and a name plate.

18. The electronic equipment chassis of claim 17 wherein the plurality of openings in the base of the bezel comprise hexagonal openings arranged in a hexagonal grid.

19. The electronic equipment chassis of claim 17 wherein the at least one insertable component comprises:
a first insert configured for mounting to the first opening, the first insert being disposed between the front of the base and the cover, the first insert being visible through the first aperture of the cover that is aligned with the first opening of the base when the cover is mounted to the base; and
a second insert configured for mounting to a back of the base, the second insert being configured to fill at least one additional opening of the base other than the first opening.

20. An electronic equipment rack comprising at least one electronic equipment chassis as recited in claim 17.

* * * * *